United States Patent
Goswami et al.

(10) Patent No.: US 11,691,871 B2
(45) Date of Patent: Jul. 4, 2023

(54) MICROELECTROMECHANICAL SYSTEM (MEMS) VIBRATION SENSOR HAVING A SEGMENTED BACKPLATE

(71) Applicant: Infineon Technologies AG, Neubiberg (DE)

(72) Inventors: Somu Goswami, Munich (DE); Christian Bretthauer, Munich (DE); Matthias Friedrich Herrmann, Munich (DE); Gunar Lorenz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/351,865

(22) Filed: Jun. 18, 2021

(65) Prior Publication Data
US 2022/0402752 A1    Dec. 22, 2022

(51) Int. Cl.
*B81B 7/00* (2006.01)
*H04R 3/00* (2006.01)

(52) U.S. Cl.
CPC ............ *B81B 7/008* (2013.01); *H04R 3/002* (2013.01); *B81B 2201/0257* (2013.01); *B81B 2201/0285* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 5,365,799 A | 11/1994 | Okada | |
| 5,492,020 A * | 2/1996 | Okada | ............... G01L 25/00 73/514.32 |
| 5,850,040 A | 12/1998 | Okada | |
| 5,959,209 A | 9/1999 | Takeuchi et al. | |
| 6,435,000 B1 | 8/2002 | Takahashi et al. | |
| 6,474,134 B1 | 11/2002 | Takahashi et al. | |
| 6,508,127 B1 | 1/2003 | Namerikawa et al. | |
| 6,546,800 B1 | 4/2003 | Namerikawa et al. | |
| 9,661,411 B1 | 5/2017 | Han et al. | |
| 2004/0020292 A1 | 2/2004 | Deng | |
| 2004/0027033 A1 | 2/2004 | Schiller | |
| 2004/0159166 A1 | 8/2004 | Schiller | |
| 2004/0221651 A1 | 11/2004 | Schiller | |

(Continued)

FOREIGN PATENT DOCUMENTS

| DE | 69124377 T2 | 6/1997 |
|---|---|---|
| DE | 102006062314 A1 | 7/2008 |

(Continued)

OTHER PUBLICATIONS

Google, "Pixel Buds 2" Google's new Pixel Buds are coming spring 2020, https://www.theverge.com/2019/10/15/20891651/new-google-pixel-buds-2-2019-wireless-features-bluetooth-price-release-date, Oct. 15, 2019, 4 pages.

(Continued)

*Primary Examiner* — Walter F Briney, III
(74) *Attorney, Agent, or Firm* — Slater Matsil, LLP

(57) ABSTRACT

A MEMS vibration sensor includes a membrane having an inertial mass, the membrane being affixed to a holder of the MEMS vibration sensor; and a segmented backplate spaced apart from the membrane, the segmented backplate being affixed to the holder.

17 Claims, 8 Drawing Sheets

(56) References Cited

U.S. PATENT DOCUMENTS

| | | |
|---|---|---|
| 2006/0272413 A1 | 12/2006 | Vaganov et al. |
| 2008/0178675 A1 | 7/2008 | Okada |
| 2011/0159627 A1 | 6/2011 | Mantravadi et al. |
| 2011/0174076 A1 | 7/2011 | Classen et al. |
| 2012/0227488 A1 | 9/2012 | Lim et al. |
| 2012/0276674 A1 | 11/2012 | Mehregany |
| 2012/0299130 A1* | 11/2012 | Langereis ............ G01P 15/0802 257/415 |
| 2013/0264663 A1 | 10/2013 | Dehe et al. |
| 2015/0276529 A1 | 10/2015 | Wiesbauer et al. |
| 2016/0340173 A1 | 11/2016 | Klein et al. |
| 2017/0026754 A1 | 1/2017 | Buck et al. |
| 2017/0078802 A1* | 3/2017 | Ravnkilde .............. H04R 19/04 |
| 2018/0035229 A1 | 2/2018 | Deas et al. |
| 2018/0099867 A1 | 4/2018 | Walther et al. |
| 2019/0016588 A1 | 1/2019 | Bretthauer et al. |
| 2019/0289405 A1 | 9/2019 | Littrell et al. |
| 2020/0196065 A1 | 6/2020 | Pedersen et al. |
| 2021/0382085 A1 | 12/2021 | Bretthauer et al. |

FOREIGN PATENT DOCUMENTS

| | | |
|---|---|---|
| DE | 102015213774 A1 | 1/2017 |
| JP | H1026571 A | 1/1998 |
| JP | H10170538 A | 6/1998 |
| JP | H10170540 A | 6/1998 |
| JP | H10332503 A | 12/1998 |
| JP | 2000275126 A | 10/2000 |

OTHER PUBLICATIONS

Sonion, "Humanizing the Digital Experience", TDK Developers Conference, Sep. 17-18, 2018, Santa Clara Marriott, US, 37 pages.

Liu, Jian et al., "Nonlinear model and system identification of a capacitive dual-backplate MEMS microphone", Elsevier, ScienceDirect, Journal of Sound and Vibration, 309, Sep. 14, 2007, 17 pages.

* cited by examiner

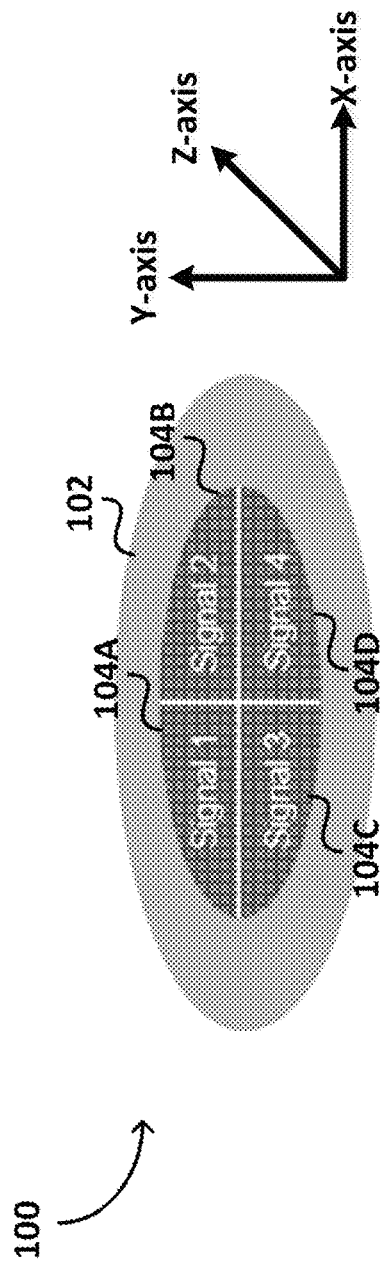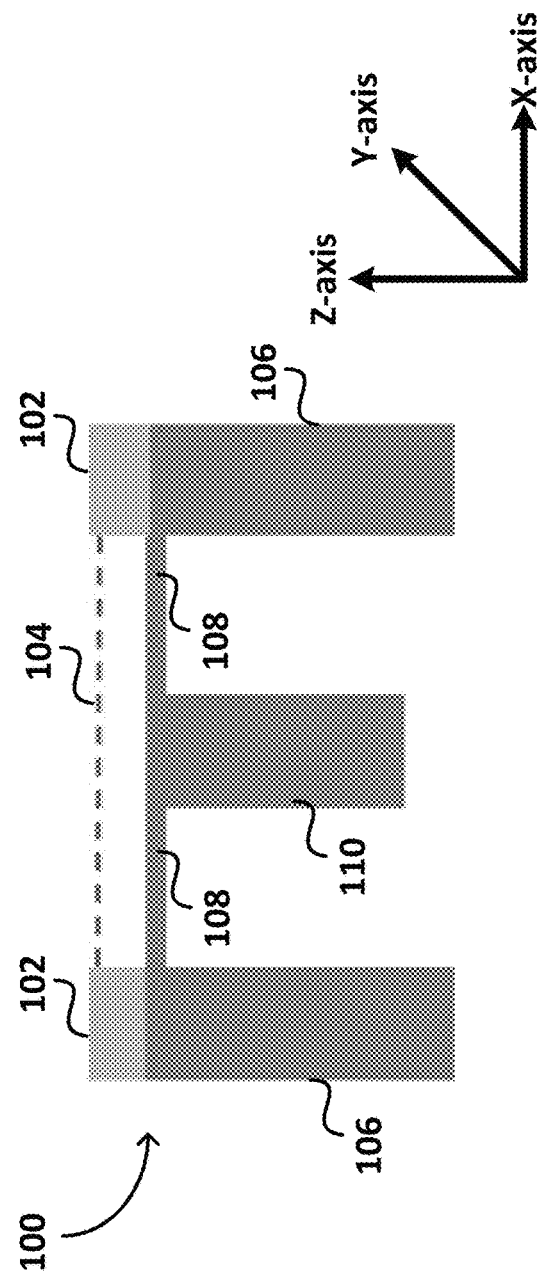
FIG. 1A
FIG. 1B

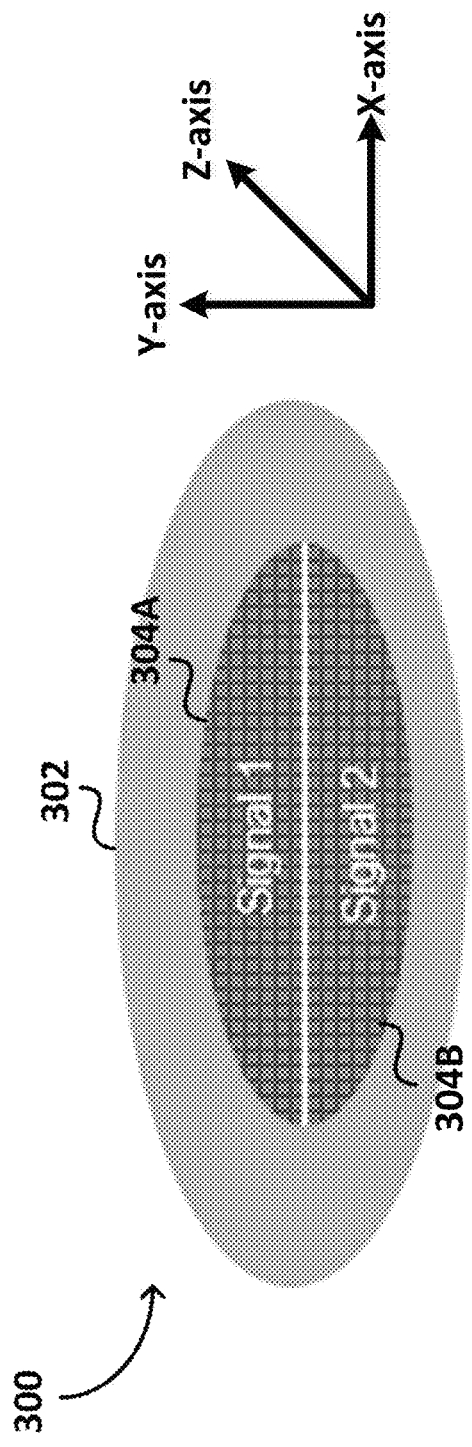
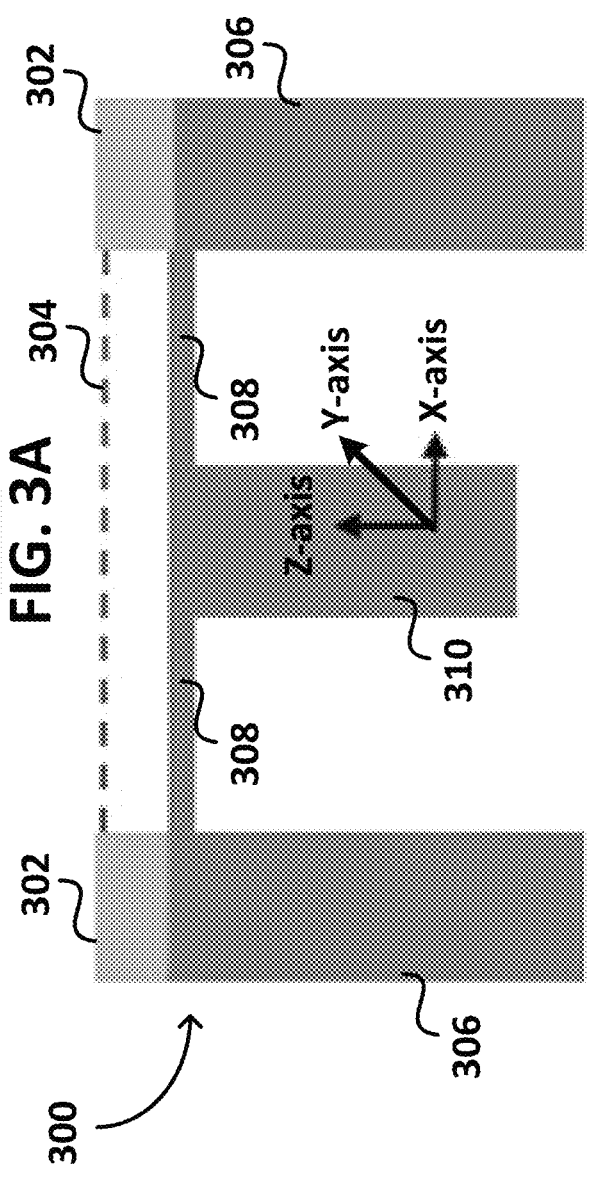
FIG. 3A
FIG. 3B

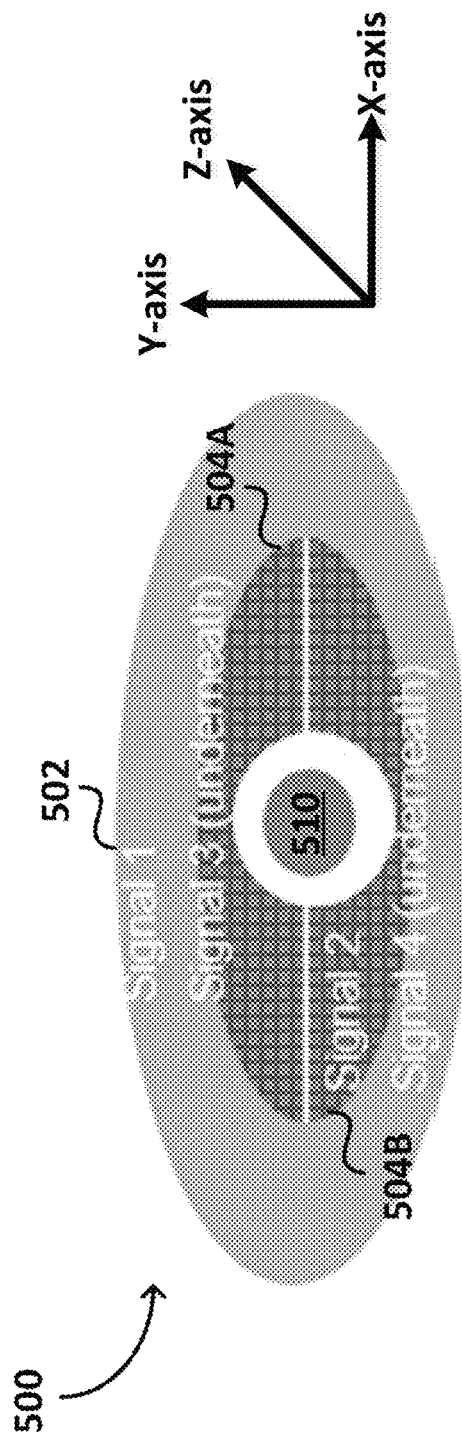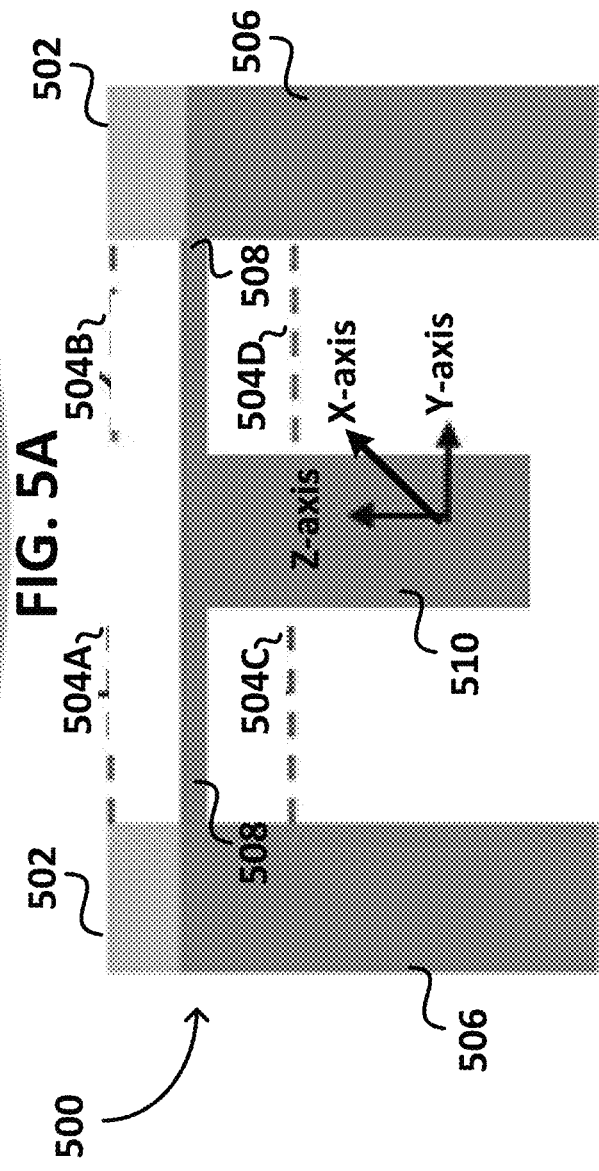

MICROELECTROMECHANICAL SYSTEM (MEMS) VIBRATION SENSOR HAVING A SEGMENTED BACKPLATE

TECHNICAL FIELD

The present invention relates generally to a MEMS vibration sensor having a segmented backplate, and, in particular embodiments, to corresponding systems and methods.

BACKGROUND

Microelectromechanical transducers play a central role in modern electronics both as sensors and also as actuators and are used in a multiplicity of different applications, for example as microphones, loudspeakers, pressure sensors or acceleration sensors.

Microelectromechanical transducers can have a membrane, which can be displaced in a passive or active manner depending on whether the transducers are formed as sensors or actuators. In the case of a microelectromechanical transducer formed as a sensor, the membrane can be displaceable in a passive manner, for example by sound to be detected or an acceleration to be detected. Characteristics of the variable to be detected, such as a sound frequency, a sound amplitude or a temporal acceleration profile, can be ascertained from a displacement of the membrane. In the case of a microelectromechanical transducer formed as an actuator, the membrane can be displaced in an active manner, for example in order to generate sound in a loudspeaker.

Such membranes of microelectromechanical transducers can be formed at least in sections from a piezoelectric material, in which, in the case of a passive displacement of the membrane, a voltage is induced, which can be read out by a suitable read-out circuit in order to ascertain characteristics of a variable to be detected. Alternatively, in the case of an actuator, a voltage can be applied to the membrane in order to bring about a targeted deformation of the membrane, for example in order to generate sound.

SUMMARY

According to an embodiment, a MEMS vibration sensor comprises a membrane comprising an inertial mass, the membrane being affixed to a holder of the MEMS vibration sensor; and a segmented backplate spaced apart from the membrane, the segmented backplate being affixed to the holder.

According to an embodiment, a method comprises affixing a membrane to a holder of a MEMS device; affixing an inertial mass to the membrane; affixing a segmented backplate to the holder; and generating a plurality of backplate segment signals in response to an acceleration of the MEMS device.

According to an embodiment, a method comprises providing a MEMS device having a membrane and a backplate; attaching an inertial mass to the membrane; segmenting the backplate into first and second backplate segments; generating a first signal from the first backplate segment; and generating a second signal from the second backplate segment.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A is a plan view of a vibration sensor having an inertial mass affixed to a membrane and a four-segmented backplate for determining a three-dimensional acceleration direction according to an embodiment;

FIG. 1B is a cross-sectional view of the vibration sensor of FIG. 1A;

FIG. 3A is a plan view of a vibration sensor having an inertial mass affixed to a membrane and a two-segmented backplate for determining a two-dimensional acceleration direction according to an embodiment;

FIG. 3B is a cross-sectional view of the vibration sensor of FIG. 3A;

FIG. 5A is a plan view of a vibration sensor having an inertial mass affixed to a membrane and first and second two-segmented backplates for determining a two-dimensional acceleration direction according to an embodiment;

FIG. 5B is a cross-sectional view of the vibration sensor of FIG. 5A;

DETAILED DESCRIPTION OF ILLUSTRATIVE EMBODIMENTS

Figure 2:
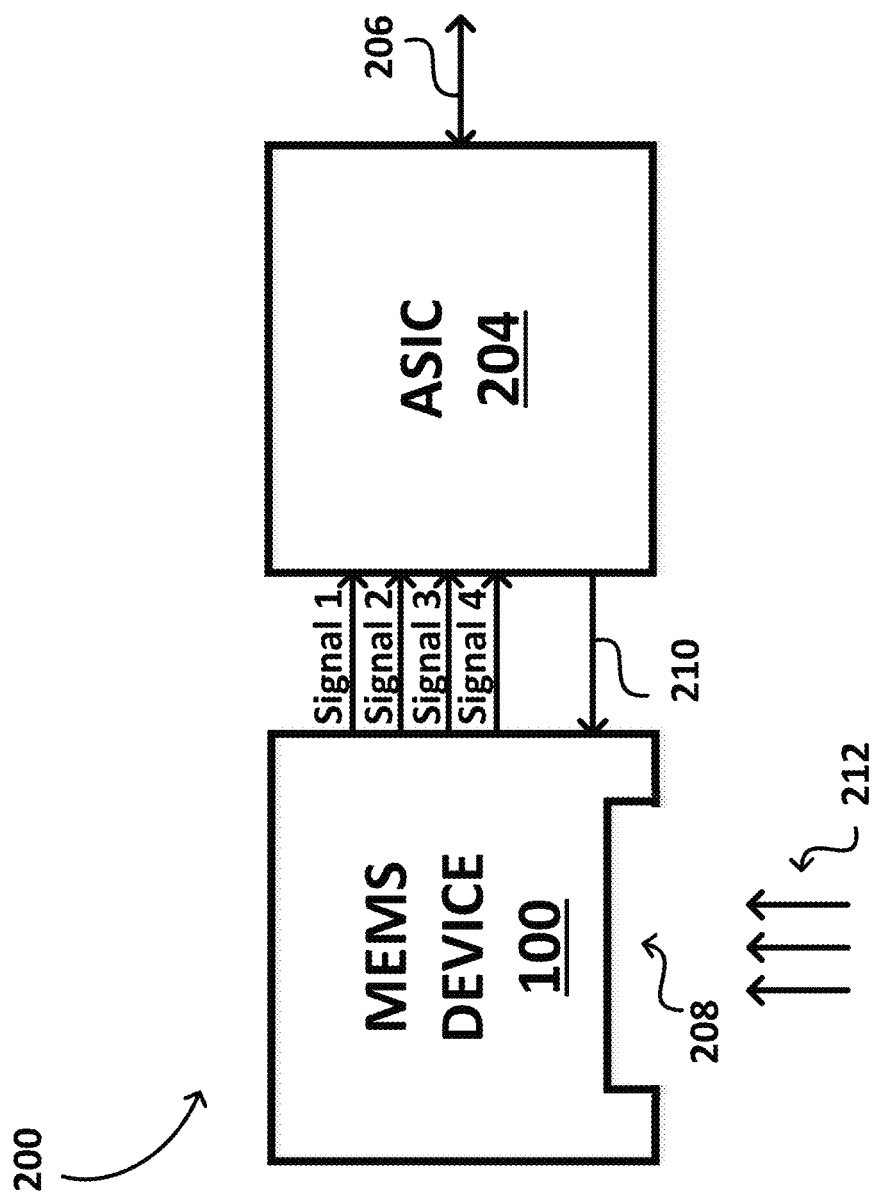
FIG. 2 is a block diagram of a system including the vibration sensor of FIG. 1A coupled to a circuit for evaluating the output signals of the vibration sensor.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments described below are related to MEMS vibration sensors, which are a type of MEMS microphone or sensor that is particularly sensitive to signals at the lower end of the audio band conducted by vibration, to vibrations, and to acceleration of the sensor. While MEMS microphones may typically be fabricated having a membrane and a backplate for generating a voltage in response to environmental (air conducted) sound waves, according to embodiments described herein a MEMS vibration sensor may have an inertial mass attached to the membrane in order to increase the sensitivity of the MEMS vibration sensor to low frequency sound waves conducted via vibrations and to vibrations. Embodiment MEMS vibration sensors can be fabricated in high volume using semiconductor production processes. Embodiments described below can combine a MEMS vibration sensor and an ASIC to process output signals of the MEMS vibration sensor. The MEMS vibration sensor creates an electrical signal that is amplified or otherwise processed by an ADC as well as other processing components in the ASIC. The MEMS microphone, which converts the audio signals and/or vibrations to an electrical signal, can comprise a MEMS DC biased capacitor, in which movement of a membrane (diaphragm) caused by audio pressure or vibrations changes the voltage with respect to a capacitor plate or plates (backplate or backplates). Electrodes associated with the backplate or backplates provide one or more output electrical signals in embodiments that are further processed by the ASIC to provide a system output signal.

The membrane and the backplate behave as a parallel plate capacitor. When the diaphragm or membrane vibrates due to incoming sound pressure or vibrations, the gap and, therefore, the capacitance between diaphragm and backplate change. Embodiment MEMS vibration sensors extract these changes and convert them to the output electrical signals of the sensor.

According to embodiments, a single membrane and a single backplate can be used in each MEMS vibration sensor. According to another embodiment, a MEMS vibration sensor places the moving membrane between two capacitor plates (dual backplates). This embodiment provides a fully differential (compared to single-ended) output, which has several advantages. A dual backplate MEMS vibration sensor may reduce distortion due to its symmetrical construction. A similar effect can also be achieved by moving two membranes that sandwich the capacitor plate (dual membrane).

Embodiments are described below comprising an implementation of a MEMS vibration sensor comprising a membrane comprising an inertial mass, the membrane being affixed to a holder of the MEMS vibration sensor; and a segmented backplate spaced apart from the membrane, the segmented backplate being affixed to the holder. The membrane, the inertial mass, and the holder can all be fabricated from bulk silicon in an integrated circuit, or fabricated out of various silicon, metal, and insulating layers, or a combination of both in various embodiments. The MEMS vibration sensor can comprise a single oval, elliptical, or oblong membrane in embodiments. The MEMS vibration sensor can comprise a segmented backplate that is configured for providing a plurality of signals. The MEMS vibration sensor can be part of a system further comprising a circuit configured for evaluating sums and/or differences of the plurality of signals. The MEMS vibration sensor and the circuit can be fabricated together in a single integrated circuit, or can be fabricated as separate components. In some embodiments, the circuit is configured for providing a first evaluation result indicative of an X-axis acceleration of the MEMS vibration sensor, a second evaluation result indicative of a Y-axis acceleration of the MEMS vibration sensor, or a third evaluation result indicative of a Z-axis acceleration of the MEMS vibration sensor. In some embodiments, the segmented backplate is segmented into four equal quadrants for providing four separate output signals and, in other embodiments, the segmented backplate is segmented into two equal halves for providing two separate output signals. In other embodiments, two segmented backplates are each segmented into two equal halves for providing four separate output signals. The segmented backplate or backplates can be perforated with ventilation holes in embodiments. In embodiments, multiple holes, flaps, or other such structures can be used to ventilate the membrane. The ventilation holes can be arranged in various patterns and configurations, including patterns and configurations not specifically illustrated. In embodiments the segmented backplate comprises a top segmented backplate arranged over the membrane. In other embodiments the segmented backplate comprises a bottom segmented backplate arranged under the membrane and affixed to the holder. In other embodiments backplate can be arranged over and under the membrane. In some embodiments a first hole is centrally located in the top segmented backplate and/or a second hole is centrally located in the bottom segmented backplate for proper operation of the inertial mass.

Inertial masses for a MEMS vibration sensor are described in further detail in U.S. patent application Ser. No. 16/896,665, entitled "Combined Corrugated Piezoelectric Microphone and Corrugated Piezoelectric Vibration Sensor", which is hereby by incorporated by reference in its entirety.

FIG. 1A is plan view and FIG. 1B is a cross-sectional view of a capacitive-type MEMS vibration sensor 100 for determining a three-dimensional acceleration direction according to an embodiment. While MEMS vibration sensor 100 is shown as a standalone component in FIG. 1A and FIG. 1B, it may be combined with a MEMS microphone into a combined MEMS device if desired.

In various applications it may be required that vibrations are picked up independent of the orientation of the MEMS vibration sensor 100. A flexible membrane, particularly in combination with a long bulk silicon inertial mass according to embodiments, will not only react to accelerations perpendicular to its surface (Z-axis), but due to torque acting on the inertial mass it will also sense in-plane acceleration (X-axis and Y-axis). These accelerations can even be disentangled if a multi-segment electrode design is chosen for MEMS vibration sensor 100 as shown in FIG. 1A and FIG. 1B. In the example of MEMS vibration sensor 100, four backplate segments are used in conjunction with a single flexible membrane and described in further detail below. While other numbers of backplate segments can be used, the corresponding acceleration equations set forth below may have to be updated to reflect the number of membrane segments chosen for a particular design.

MEMS vibration sensor 100 includes a holder that includes a bottom portion 106 and an upper portion 102. In embodiments the bottom portion 106 and the upper portion may be etched from bulk silicon. In other embodiments the bottom portion 106 may be etched from bulk silicon, and the upper portion 102 may be a separate silicon or insulator layer on top of the bottom portion 106. In an embodiment a single holder is coupled to a single flexible membrane 108. In other embodiments, multiple individual holders can be used to support flexible membrane 108. A segmented backplate 104 is affixed to the upper portion 102 of the holder and is arranged above and spaced apart from flexible membrane 108. Segmented backplate 104 has four segments 104A, 104B, 104C, and 104D in an embodiment for generating four corresponding signals: Signal 1 (s1), Signal 2 (s2), Signal 3 (s3), and Signal 4 (s4). In an embodiment, each backplate segment 104A, 104B, 104C, and 104D is an equally-sized quadrant of segmented backplate 104. Each backplate segment 104A, 104B, 104C, and 104D includes one or more electrodes (not shown in FIG. 1A or FIG. 1B). In embodiments, the electrodes may be located in the upper portion 102 of the holder, and may contact a portion of a corresponding backplate portion embedded in the upper portion 102 of the holder. Segmented backplate 104 comprises a plurality of ventilation holes or perforations that can be used to tune the frequency response and other acoustic properties of MEMS vibration sensor 100 according to an embodiment. Flexible membrane 108 is coupled to an inertial mass no that may include a bulk silicon portion, and/or may include thin film material layers such as silicon, insulator, or metal layers. In an embodiment, the bottom portion 106 of the holder may be part of or affixed to a silicon or insulative substrate, whereas the length of the inertial mass 110 may be shorter than the length of the bottom portion 106 of the holder. The larger the volume of the inertial mass, however, the more torque will be generated in MEMS vibration sensor 100 for a given acceleration. For a thin film layer inertial mass, the output signal for a given acceleration may be considerably smaller. In an embodiment, flexible membrane 108 can have an oval, elliptical, or oblong shape. FIG. 1A defines the acceleration direction in the X-axis, which is colinear with the major axis of segmented backplate 104, wherein the Y-axis direction is orthogonal to the X-axis direction in the plane of FIG. 1A, and wherein the Z-axis direction is orthogonal to the X-axis direction extending out from the plane of FIG. 1A. FIG. 1B defines the acceleration direction in the X-axis, which is colinear with the cross-section view of segmented backplate 104, wherein the Z-axis direction is orthogonal to the X-axis direction in the plane of FIG. 1B, and wherein the Y-axis direction is orthogonal to the X-axis direction extending out from the plane of FIG. 1B.

By evaluating sums and differences of the four signals (Signal 1, Signal 2, Signal 3, and Signal 4), acceleration and vibrations in the X, Y, and Z directions can be calculated.

Acceleration and vibrations in the X-axis direction are determined by the following equations.

Signal1=Signal3

Signal2=Signal4

Signal1≈−Signal2

Acceleration and vibrations in the Y-axis direction are determined by the following equations.

Signal1=Signal2

Signal3=Signal4

Signal1≈−Signal3

Acceleration and vibrations in Z-axis direction is determined by the following equation.

Signal1=Signal2=Signal3=Signal4

Acceleration signal proportionalities alpha ($\alpha$) and beta ($\beta$) are design specific sensitivities to acceleration and vibration conditions and s1 to s4 (the signals from the four backplate segments) described by the following equations.

$a_x \propto \alpha(s1+s3-s2-s4)$ $a_y \propto \alpha(s1+s2-s3-s4)$ $a_z \propto \beta(s1+s3+s2+s4)$ MEMS vibration sensor 100 may be combined with a MEMS microphone (not shown in FIG. 1A or FIG. 1B) into a combined MEMS device if desired by combining one of the edges of the holder with one of the holders of the MEMS microphone, if a single holder is used. If multiple holders are used, MEMS vibration sensor 100 may combined with a MEMS microphone into a combined MEMS device combining one of the multiple holders with one of the holders of the MEMS microphone. MEMS vibration sensor 100 may also be integrated on the same integrated circuit with integrated circuitry, or may be in electrical communication with one or more integrated circuits in a system.

FIG. 2 is a block diagram of a system 200 including the MEMS vibration sensor 100 of FIG. 1A and FIG. 1B coupled to an (Application-Specific Integrated Circuit) ASIC 204 for evaluating the output signals of the MEMS vibration sensor 100. MEMS vibration sensor 100 is shown as a package having a port for exposing the internal MEMS device to low frequency pressure waves 212, in some embodiments. In other embodiments, a sealed package without a port may be used. MEMS vibration sensor 100 is shown to have four outputs for generating output signals Signal 1, Signal 2, Signal 3, and Signal 4, and an input 210 for receiving one or more bias voltages. ASIC 204 is configured for evaluating sums and/or differences of the plurality of signals Signal 1, Signal 2, Signal 3, and Signal 4 in the manner described above to determine vibrations and/or acceleration in the X-axis, Y-axis, or Z-axis directions. ASIC 204 also includes a bus 206 for receiving control signals and other input signals, and for generating evaluation output data. MEMS vibration sensor 100 can be integrated together with ASIC 204 on a single integrated circuit, or can be separate components fabricated together on a common substrate. ASIC 204, as well as the other ASIC circuits described below can include further signal processing circuitry such as analog-to-digital converts (ADCs), amplifiers, filters, and other digital and analog circuit components. ASIC 204, as well as the other ASIC circuits described below can be in electrical or data communication with a microprocessor or other processing components through bus 206.

FIG. 3A is a plan view and FIG. 3B is a cross-sectional view of a MEMS vibration sensor 300 having an inertial mass 310 affixed to a flexible membrane 308 and a two-segmented backplate 304 including a first backplate segment 304A and a second backplate segment 304B for determining a two-dimensional acceleration direction according to an embodiment. In embodiments the first backplate segment 304A and the second backplate segment 304B are equal halves separated along the major axis of the two-segmented backplate 304. In an embodiment the two-segmented backplate 304 is affixed to an upper portion 302 of a holder, and the flexible membrane 308 is affixed to a lower portion 306 of the holder. The orientation of MEMS vibration sensor 300 shown in FIG. 3A and FIG. 3B is the same as those shown and described above with respect to MEMS vibration sensor 100 shown in FIG. 1A and FIG. 1B.

The backplate segmentation of two-segmented backplate 304 into two parts enables a two axis vibration signal to be identified. In-device placement of MEMS vibration sensor 300 enables the desired axes signal to be identified. Using the placement of MEMS vibration sensor 300 shown in FIG. 3A, vibrations or accelerations along the Y-axis direction can be sensed, whereas vibrations or accelerations along the X-axis direction cannot be sensed. Based on the segmentation axis vibrations or acceleration in either the X-axis or the Y-axis (i.e. one of the two planar axes) can be sensed. For example, to sense vibrations or accelerations along the X-axis direction, the orientation of the MEMS vibration sensor 300 shown in FIG. 3A should be rotated 90° with respect to the orientation now shown. Vibrations or acceleration in the Z-axis can be sensed regardless of the planar orientation of MEMS vibration sensor 300.

Acceleration signal proportionalities alpha ($\alpha$) and beta ($\beta$), described above, are design specific sensitivities to acceleration and vibration conditions and s1 and s2 (the signals from the two backplate segments) and are described by the following equations.

$a_{x/y} \propto \alpha(s1-s2)$ $a_z \propto \beta(s1+s2)$

Thus, MEMS vibration sensor 300 can provide output signals responsive to X-axis and Y-axis acceleration and vibrations given the proper orientation of the sensor or if the orientation of the sensor can be determined, whereas MEMS vibration sensor 300 can provide output signals responsive to Z-axis acceleration and vibrations regardless of the planar orientation of the sensor. The output signals of MEMS vibration sensor 300 are further processed in an ASIC, which is described in further detail below with respect to FIG. 4.

Figure 4:
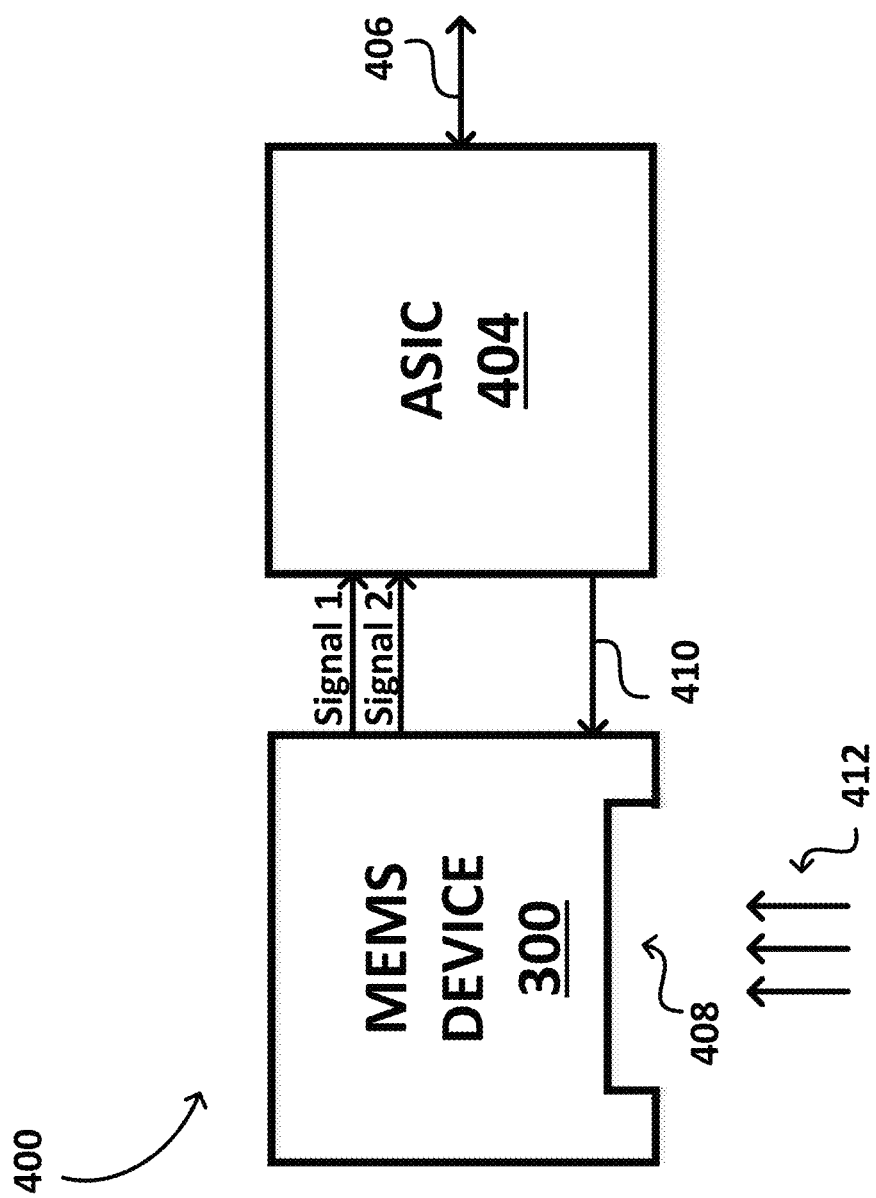
FIG. 4 is a block diagram of a system including the vibration sensor of FIG. 3A coupled to a circuit for evaluating the output signals of the vibration sensor.

FIG. 4 is a block diagram of a system 400 including the MEMS vibration sensor 300 of FIG. 3A and FIG. 3B coupled to an ASIC 404 for evaluating the output signals of the MEMS vibration sensor 300. MEMS vibration sensor 300 is shown as a package having a port for exposing the internal MEMS device to low frequency pressure waves 412, in some embodiments. MEMS vibration sensor 300 is shown to have two outputs for generating output signals Signal 1 and Signal 2 and an input 410 for receiving one or more bias voltages. ASIC 404 is configured for evaluating sums and/or differences of the output signals Signal 1 and Signal 2 in the manner described above to determine vibrations and/or acceleration in the X-axis, Y-axis, or Z-axis directions. ASIC 404 also includes a bus 406 for receiving control signals and other input signals, and for generating evaluation output data. MEMS vibration sensor 300 can be integrated together with ASIC 404 on a single integrated circuit, or can be separate components fabricated together on a common substrate.

FIG. 5A is a plan view and FIG. 5B is a cross-sectional view of a MEMS vibration sensor 500 having an inertial mass 510 affixed to a flexible membrane 508 and a four-segmented backplate including a first backplate segment 504A, a second backplate segment 504B, a third backplate segment 504C, and a fourth backplate segment 504D for determining a two-dimensional acceleration direction according to an embodiment. In an embodiment, the first backplate segment 504A and the second backplate segment 504B are arranged to be spaced apart and above flexible membrane 508, wherein the third backplate segment 504C and the fourth backplate segment 504D are arranged to be spaced apart and below flexible membrane 508.

MEMS vibration sensor 500 provides differential capacitive MEMS signal evaluation using backplate segmentation having two equal halves (first backplate segment 504A and second backplate segment 504B) forming an upper backplate and having two equal halves (third backplate segment 504C and fourth backplate segment 504D) forming a lower backplate. As in MEMS vibration sensor 300, two-axis (X-axis or Y-axis, and Z-axis) vibration signals can be identified. In-device placement or knowledge of the in-device placement in the X-axis and Y-axis allows the desired axes signals to be identified.

The upper backplate comprising first backplate segment 504A and second backplate segment 504B, and the lower backplate comprising third backplate segment 504C and fourth backplate segment 504D comprise flat rings with a hole through the center for the placement of the inertial mass 510. Since MEMS vibration sensor 500 operates differentially, the upper and lower backplates are substantially similar, although the inertial mass 510 does not actually extend through the hole in the upper backplate, in embodiments. In some embodiments, the inner edges of the upper and lower backplates can be further stabilized to act as a soft-bumper for the inertial mass 510, which advantageously increases the robustness of MEMS vibration sensor 500. In embodiments, the upper and lower backplates can both be perforated as is shown in FIG. 5B.

In embodiments the first backplate segment 504A and the second backplate segment 504B are equal halves, and the third backplate segment 504C and the fourth backplate segment 504D are also equal halves, separated along the major axis of the two-segmented backplate. In an embodiment the upper backplate is affixed to an upper portion 502 of a holder, and the lower backplate is affixed to a lower portion 506 of the holder. The orientation of MEMS vibration sensor 500 shown in FIG. 5A and FIG. 5B is the same as those shown and described above with respect to MEMS vibration sensor 300 shown in FIG. 3A and FIG. 3B.

The backplate segmentation of upper and lower two-segmented backplates each into two parts enables a two axis vibration signal to be identified. In-device placement of MEMS vibration sensor 500 enables the desired axes signal to be identified. Using the placement of MEMS vibration sensor 500 shown in FIG. 5A, vibrations or accelerations along the Y-axis direction can be sensed, whereas vibrations or accelerations along the X-as direction cannot be sensed. Based on the segmentation axis vibrations or acceleration in either the X-axis or the Y-axis (i.e. one of the two planar axes) can be sensed. For example, to sense vibrations or accelerations along the X-axis direction, the orientation of the MEMS vibration sensor 500 shown in FIG. 5A should be rotated 90° with respect to the orientation now shown. Vibrations or acceleration in the Z-axis can be sensed regardless of the planar orientation of MEMS vibration sensor 500.

Acceleration signal proportionalities alpha ($\alpha$) and beta ($\beta$), described above, are design specific sensitivities to acceleration and vibration conditions and s1 and s2 (the signals from the two backplate segments) and are described by the following equations.

$$a_{x/y} \propto \alpha(s1+s4-s2-s3)$$

$$a_z \propto \beta(s1+s2-s3-s4)$$

Thus, MEMS vibration sensor 500 can provide output signals responsive to X-axis and Y-axis acceleration and vibrations given the proper orientation of the sensor or if the orientation of the sensor can be determined, whereas MEMS vibration sensor 500 can provide output signals responsive to Z-axis acceleration and vibrations regardless of the planar orientation of the sensor. The output signals of MEMS vibration sensor 500 are further processed in an ASIC, which is described in further detail below with respect to FIG. 6.

Figure 6:
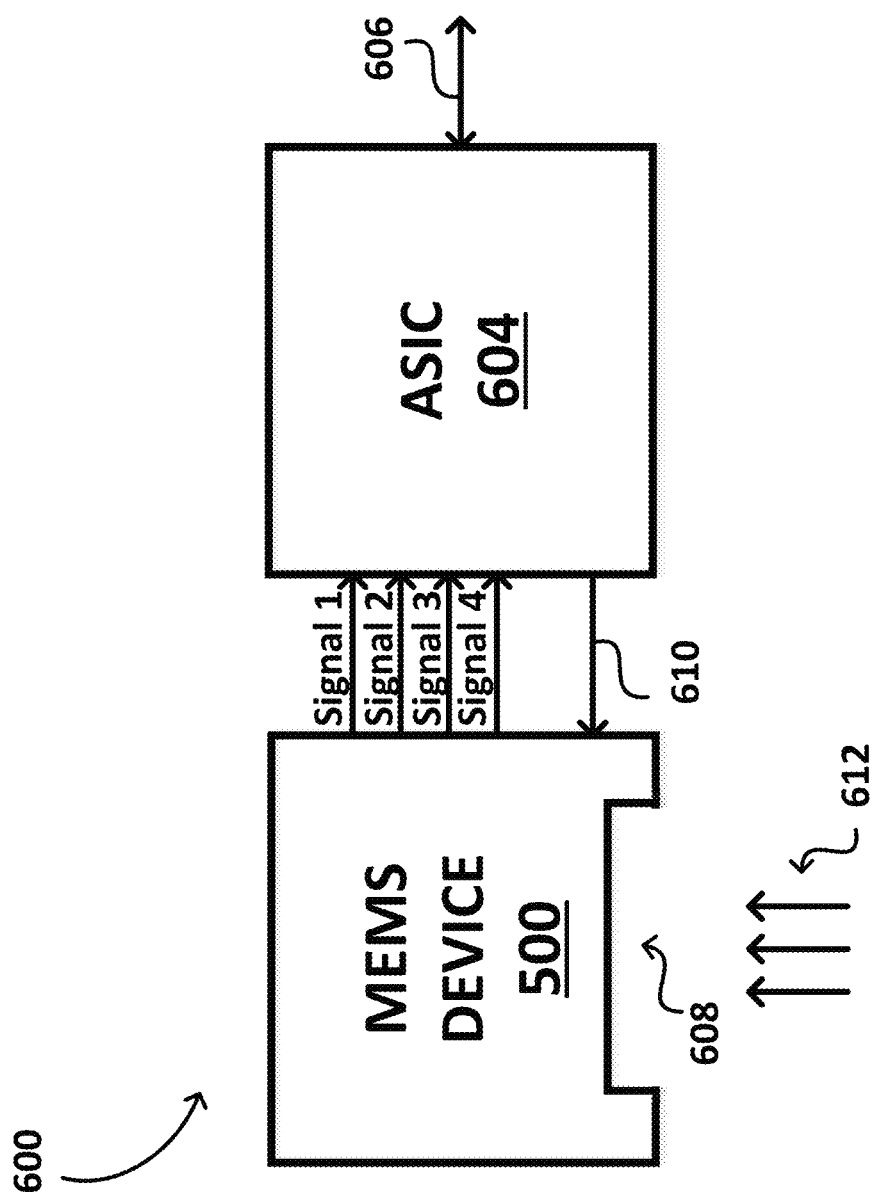
FIG. 6 is a block diagram of a system including the vibration sensor of FIG. 5A coupled to a circuit for evaluating the output signals of the vibration sensor.

FIG. 6 is a block diagram of a system 600 including the MEMS vibration sensor 500 of FIG. 5A and FIG. 5B coupled to an ASIC 604 for evaluating the output signals of the MEMS vibration sensor 500. MEMS vibration sensor 500 is shown as a package having a port for exposing the internal MEMS device to low frequency pressure waves 612, in some embodiments. MEMS vibration sensor 500 is shown to have four outputs for generating output signals Signal 1, Signal 2, Signal 3, and Signal 4, and an input 610 for receiving one or more bias voltages. ASIC 604 is configured for evaluating sums and/or differences of the output signals in the manner described above to determine vibrations and/or acceleration in the X-axis, Y-axis, or Z-axis directions. ASIC 604 also includes a bus 606 for receiving control signals and other input signals, and for generating evaluation output data. MEMS vibration sensor 500 can be integrated together with ASIC 604 on a single integrated circuit, or can be separate components fabricated together on a common substrate.

Figure 7:
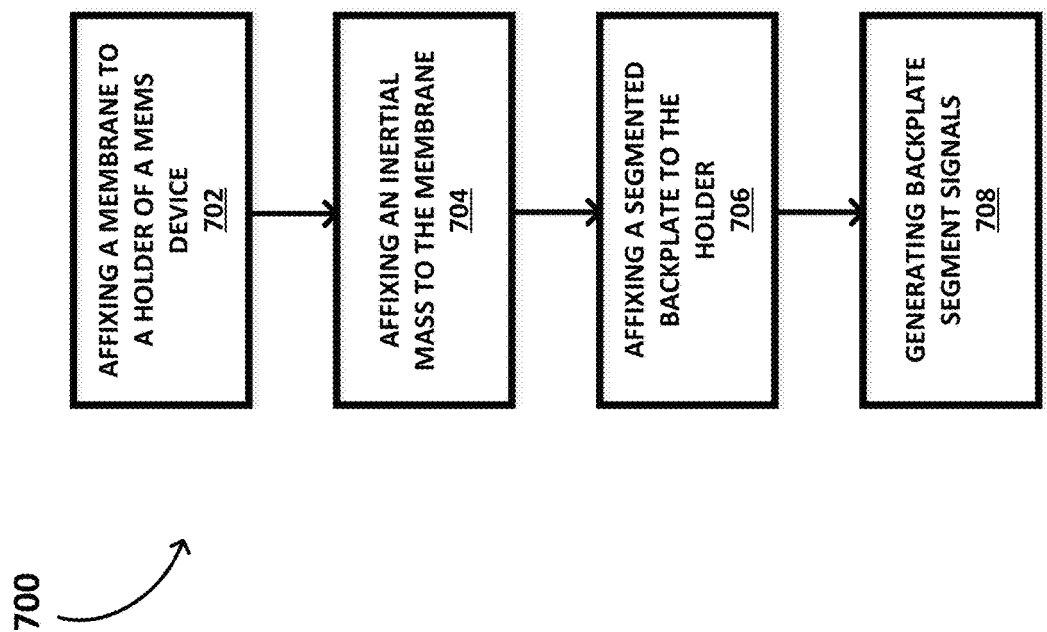
FIG. 7 is a block diagram of a vibration sensing method according to an embodiment.

FIG. 7 is a block diagram of a vibration sensing method 700 according to an embodiment, the method comprising affixing a membrane to a holder of a MEMS device at step 702; affixing an inertial mass to the membrane at step 704;

affixing a segmented backplate to the holder at step 706; and generating a plurality of backplate segment signals in response to an acceleration of the MEMS device at step 708.

Figure 8:
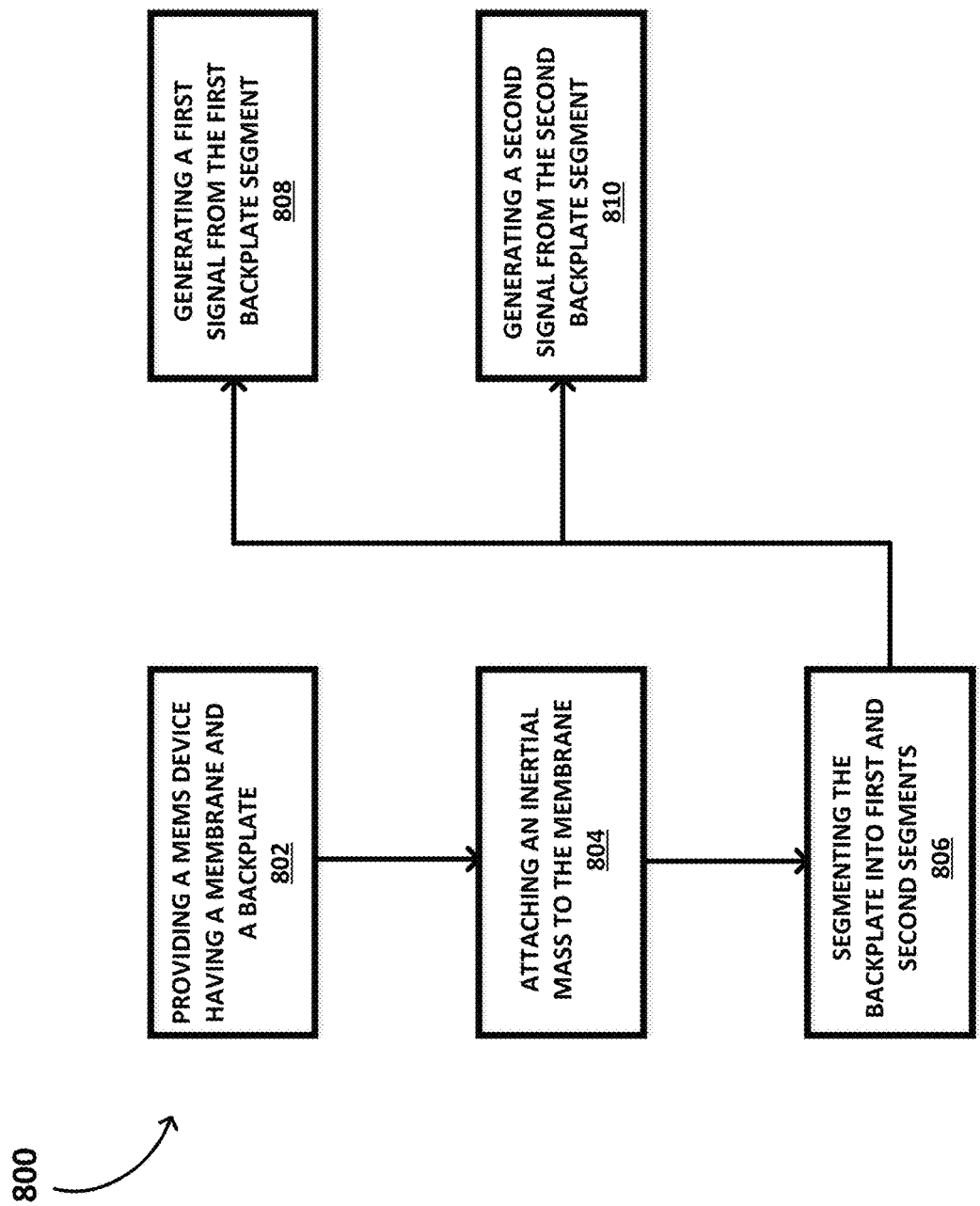
FIG. 8 is a block diagram of another vibration sensing method according to an embodiment.

FIG. 8 is a block diagram of a vibration sensing method 800 according to an embodiment, the method comprising providing a MEMS device having a membrane and a backplate at step 802; attaching an inertial mass to the membrane at step 804; segmenting the backplate into first and second backplate segments at step 806; generating a first signal from the first backplate segment at step 808; and generating a second signal from the second backplate segment at step 810.

Example embodiments of the present invention are summarized here. Other embodiments can also be understood from the entirety of the specification and the claims filed herein.

Example 1. According to an embodiment, a MEMS vibration sensor comprises a membrane comprising an inertial mass, the membrane being affixed to a holder of the MEMS vibration sensor; and a segmented backplate spaced apart from the membrane, the segmented backplate being affixed to the holder.

Example 2. The MEMS vibration sensor of Example 1, wherein the membrane comprises an oval membrane.

Example 3. The MEMS vibration sensor of any of the above examples, wherein the segmented backplate is configured for providing a plurality of signals.

Example 4. The MEMS vibration sensor of any of the above examples, further comprising a circuit configured for evaluating sums and/or differences of the plurality of signals.

Example 5. The MEMS vibration sensor of any of the above examples, wherein the circuit is configured for providing a first evaluation result indicative of an X-axis acceleration of the MEMS vibration sensor, a second evaluation result indicative of a Y-axis acceleration of the MEMS vibration sensor, or a third evaluation result indicative of a Z-axis acceleration of the MEMS vibration sensor.

Example 6. The MEMS vibration sensor of any of the above examples, wherein the segmented backplate is segmented into four equal quadrants.

Example 7. The MEMS vibration sensor of any of the above examples, wherein the segmented backplate is segmented into two equal halves.

Example 8. The MEMS vibration sensor of any of the above examples, wherein the segmented backplate comprises a perforated backplate.

Example 9. The MEMS vibration sensor of any of the above examples, wherein the segmented backplate comprises a top segmented backplate arranged over the membrane.

Example 10. The MEMS vibration sensor of any of the above examples, further comprising a bottom segmented backplate arranged under the membrane and affixed to the holder.

Example 11. The MEMS vibration sensor of any of the above examples, further comprising a first hole centrally located in the top segmented backplate and/or a second hole centrally located in the bottom segmented backplate.

Example 12. According to an embodiment, a method comprises affixing a membrane to a holder of a MEMS device; affixing an inertial mass to the membrane; affixing a segmented backplate to the holder; and generating a plurality of backplate segment signals in response to an acceleration of the MEMS device.

Example 13. The method of Example 12, further comprising evaluating sums and/or differences of the plurality of backplate segment signals.

Example 14. The method of any of the above examples, further comprising summing a first backplate segment signal and a second backplate segment signal from first and second backplate segments to provide a first sum; summing a third backplate segment signal and a fourth backplate segment signal from third and fourth backplate segments to provide a second sum; and calculating a difference between the first and second sums to generate a signal indicative of an X-axis acceleration of the MEMS device or a Y-axis acceleration of the MEMS device.

Example 15. The method of any of the above examples, further comprising calculating a difference between a first backplate segment signal and a second backplate segment signal to generate a signal indicative of an X-axis acceleration of the MEMS device or a Y-axis acceleration of the MEMS device.

Example 16. The method of any of the above examples, further comprising calculating a sum of a first backplate segment signal and a second backplate segment signal to generate a signal indicative of a Z-axis acceleration of the MEMS device.

Example 17. According to an embodiment, a method comprises providing a MEMS device having a membrane and a backplate; attaching an inertial mass to the membrane; segmenting the backplate into first and second backplate segments; generating a first signal from the first backplate segment; and generating a second signal from the second backplate segment.

Example 18. The method of Example 17, further comprising calculating a difference between first and second signals to generate a signal indicative of an acceleration of the MEMS device.

Example 19. The method of any of the above examples, further comprising orienting a major axis of the membrane to be substantially orthogonal to a planar acceleration direction of the MEMS device.

Example 20. The method of any of the above examples further comprising calculating a sum of the first and second signals to generate a signal indicative of an acceleration of the MEMS device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A MEMS vibration sensor comprising:
   a membrane comprising an inertial mass, the membrane being affixed to a holder of the MEMS vibration sensor; and
   a segmented backplate spaced apart from the membrane, the segmented backplate being affixed to the holder,
   wherein the segmented backplate comprises a top segmented backplate arranged over the membrane, a bottom segmented backplate arranged under the membrane and affixed to the holder, a first hole centrally located in the top segmented backplate, and a second hole centrally located in the bottom segmented backplate.

2. The MEMS vibration sensor of claim 1, wherein the membrane comprises an oval membrane.

3. The MEMS vibration sensor of claim 1, wherein the segmented backplate is configured for providing a plurality of signals.

4. The MEMS vibration sensor of claim 3, further comprising a circuit configured for evaluating sums and/or differences of the plurality of signals.

5. The MEMS vibration sensor of claim 4, wherein the circuit is configured for providing a first evaluation result indicative of an X-axis acceleration of the MEMS vibration sensor, a second evaluation result indicative of a Y-axis acceleration of the MEMS vibration sensor, or a third evaluation result indicative of a Z-axis acceleration of the MEMS vibration sensor.

6. The MEMS vibration sensor of claim 1, wherein the segmented backplate is segmented into four equal sections.

7. The MEMS vibration sensor of claim 1, wherein the top segmented backplate is segmented into two equal halves, and wherein the bottom segmented backplate is segmented into two equal halves.

8. The MEMS vibration sensor of claim 1, wherein the segmented backplate comprises a perforated backplate.

9. A method comprising:
affixing a membrane to a holder of a MEMS device;
affixing an inertial mass to the membrane;
affixing a segmented backplate to the holder; and
generating a plurality of backplate segment signals in response to an acceleration of the MEMS device,
wherein the segmented backplate comprises a top segmented backplate arranged over the membrane, a bottom segmented backplate arranged under the membrane and affixed to the holder, a first hole centrally located in the top segmented backplate, and a second hole centrally located in the bottom segmented backplate.

10. The method of claim 9, further comprising evaluating sums and/or differences of the plurality of backplate segment signals.

11. The method of claim 10, further comprising:
summing a first backplate segment signal and a second backplate segment signal from first and second backplate segments to provide a first sum;
summing a third backplate segment signal and a fourth backplate segment signal from third and fourth backplate segments to provide a second sum; and
calculating a difference between the first and second sums to generate a signal indicative of an X-axis acceleration of the MEMS device or a Y-axis acceleration of the MEMS device.

12. The method of claim 10, further comprising calculating a difference between a first backplate segment signal and a second backplate segment signal to generate a signal indicative of an X-axis acceleration of the MEMS device or a Y-axis acceleration of the MEMS device.

13. The method of claim 10, further comprising calculating a sum of a first backplate segment signal and a second backplate segment signal to generate a signal indicative of a Z-axis acceleration of the MEMS device.

14. A method comprising:
providing a MEMS device having a membrane and a backplate;
attaching an inertial mass to the membrane;
segmenting the backplate into first and second backplate segments;
generating a first signal from the first backplate segment; and
generating a second signal from the second backplate segment,
wherein the backplate comprises a top segmented backplate arranged over the membrane, a bottom segmented backplate arranged under the membrane and affixed to a holder, a first hole centrally located in the top segmented backplate, and a second hole centrally located in the bottom segmented backplate.

15. The method of claim 14, further comprising calculating a difference between the first and second signals to generate a signal indicative of an acceleration of the MEMS device.

16. The method of claim 14, further comprising orienting a major axis of the membrane to be substantially orthogonal to a planar acceleration direction of the MEMS device.

17. The method of claim 14 further comprising calculating a sum of the first and second signals to generate a signal indicative of an acceleration of the MEMS device.

* * * * *